United States Patent
Bennett et al.

(10) Patent No.: US 8,344,240 B2
(45) Date of Patent: Jan. 1, 2013

(54) SOLAR PANEL LIGHT INDICATOR/DECORATIVE SYSTEM

(75) Inventors: James D. Bennett, Hroznetin (CZ); Bruce E. Garlick, Austin, TX (US)

(73) Assignee: Enpulz, LLC, Chicago, IL (US)

( * ) Notice: Subject to any disclaimer, the term of this patent is extended or adjusted under 35 U.S.C. 154(b) by 372 days.

(21) Appl. No.: 12/323,448

(22) Filed: Nov. 25, 2008

(65) Prior Publication Data
US 2010/0043869 A1 Feb. 25, 2010

Related U.S. Application Data

(63) Continuation-in-part of application No. 12/197,720, filed on Aug. 25, 2008.

(51) Int. Cl.
*H02N 6/00* (2006.01)
*H01L 31/042* (2006.01)

(52) U.S. Cl. ...................................... 136/251
(58) Field of Classification Search .................. 136/251
See application file for complete search history.

(56) References Cited

U.S. PATENT DOCUMENTS

| | | | |
|---|---|---|---|
| 2006/0042679 A1* | 3/2006 | Choi et al. | 136/244 |
| 2009/0014057 A1* | 1/2009 | Croft et al. | 136/248 |

* cited by examiner

Primary Examiner — Mark F Huff
Assistant Examiner — Shannon Gardner
(74) Attorney, Agent, or Firm — Garlick & Markison; Bruce E. Garlick

(57) ABSTRACT

A solar power generation system containing a plurality of roofing tiles, each of which containing a housing that encloses photovoltaic panels, solar panel control systems and light sources (light source). The housing and solar panel control system, in addition, may also contain modules and assemblies such as solar panel processing circuitry, communication and power interfaces, heater assembly, electrical rotational assembly, self cleaning assembly, and so forth. For optimal functioning, it is essential that all these modules incorporated within the housing function properly. The light sources are communicatively coupled to the solar panel processing circuitry and a central control unit; and are operable to produce a visible output. The light sources identify a solar panel among plurality of solar panels of the solar power generation system, and display a visible light that indicates operating condition of that solar panel. The visible light may indicate, for instance, problems related to the maintenance, cleaning, solar panel positional adjustment, and heater assembly. The visible light may also indicate operational conditions of a plurality of solar panels, within a block of roofing tiles; where rest of the roofing tiles are incorporated with minimum number of light sources, to minimize the cost. In addition, the visible output may display colorful holiday lighting and advertisements, especially at the roofing edges.

31 Claims, 9 Drawing Sheets

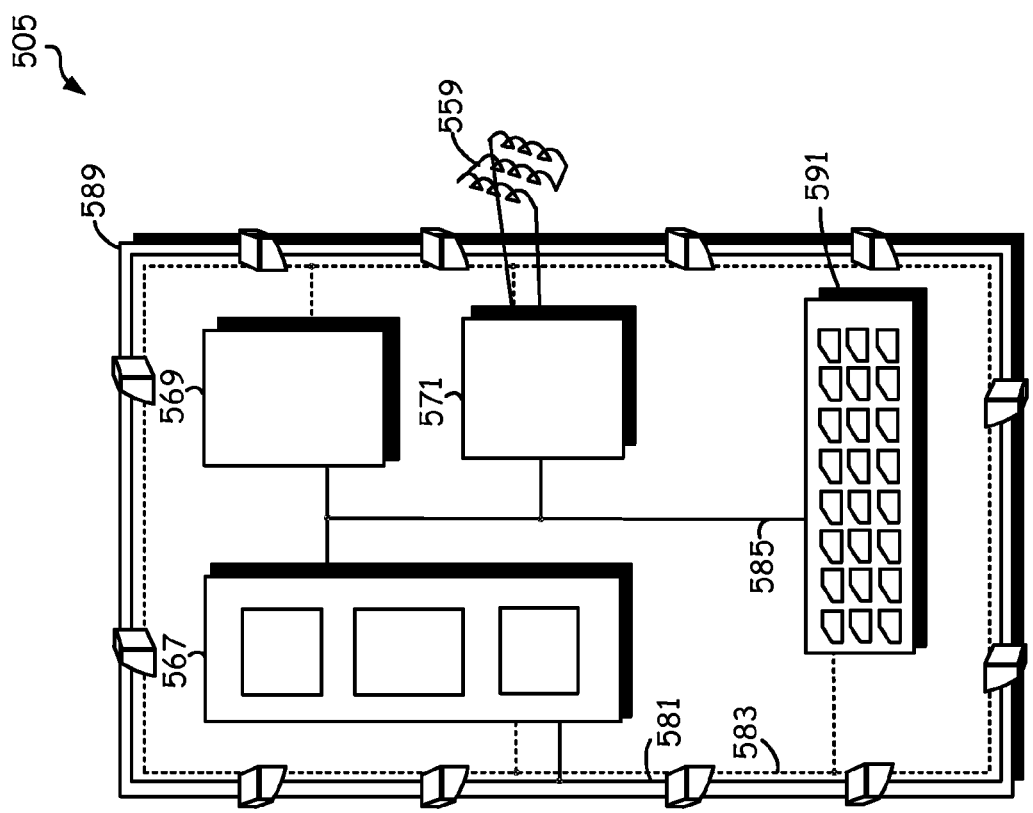
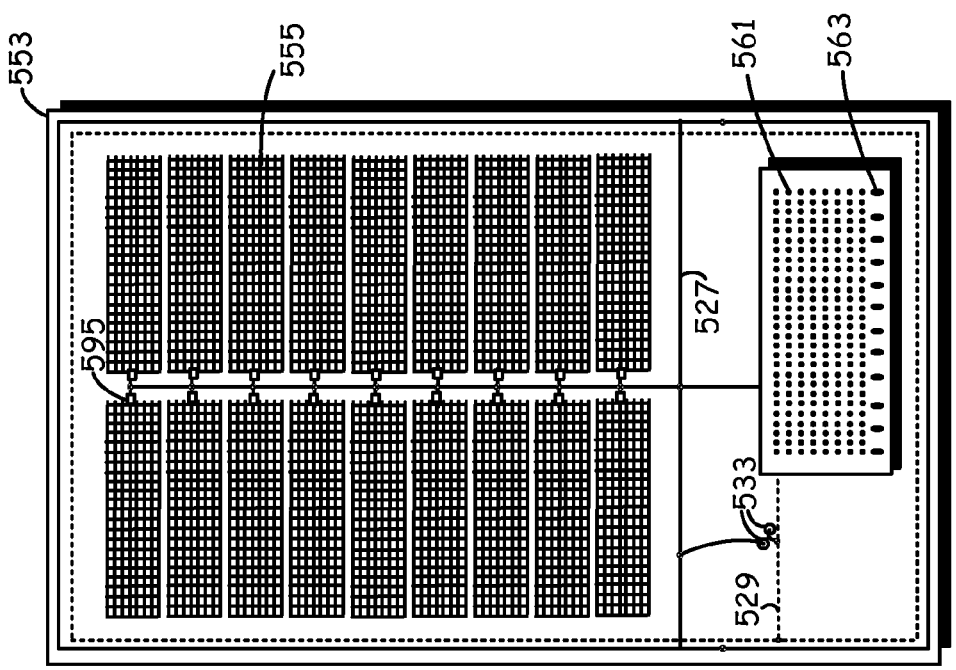
FIG. 5

SOLAR PANEL LIGHT INDICATOR/DECORATIVE SYSTEM

CROSS REFERENCES TO RELATED APPLICATIONS

The present application is a continuation-in-part and claims priority under 35 U.S.C. 120 to U.S. Utility Application Ser. No. 12/197,720, filed Aug. 25, 2008, which is incorporated herein by reference in its entirety for all purposes.

BACKGROUND

1. Technical Field

The present invention relates generally to electrical power generation and more particularly to photo voltaic electrical power generation.

2. Related Art

Today, most of the electrical power generated that is used to light and heat houses and buildings is derived from coal, petroleum, hydro electric dams, nuclear power, wind power, ocean current power and so forth. The electrical power is generated at power plants by utility companies and delivered to end users via transmission lines and distribution lines. The electrical power is distributed within homes and businesses at usable voltages. Power meters measure power consumed and a utility company bills the end user for such consumed power.

Most currently used techniques for generating electrical power have a fuel cost. All facilities for generating electrical power have a facility cost. Further, the cost of transmission and distribution lines is substantial. Power loss during transmission of the electrical power from the power plants to the end users can be substantial. As electrical power consumption continues to increase additional facilities must be constructed to service the increase in demand.

Fossil fuels, such as petroleum and coal that produce most electrical energy are non-renewable. The price of these natural resources continues to increase. In cases of hydro electric power generation, the available electric output depends entirely upon natural circumstances such as rain fall. For instance, during years when rainfall is low, power generation is also low, which affects the entire community who use this source of electrical power. Wind power is typically only available during daylight hours and fluctuates both seasonally and based upon local weather patterns. In the case of nuclear power, the technology is expensive, construction of power generating stations is expensive, and nuclear hazards cannot entirely be ruled out, in spite of extensive safeguards. Nuclear power generation is not available in many regions of the world because of security concerns.

In addition, adverse environmental effects from all of these power generation methods are enormous. In other words, each of these power generation methods has its own adverse environmental effects such as hydro electric dams adversely affecting bio-diversity and possibly causing floods of enormous destruction should a dam burst. Wind power generation takes huge amounts of land and may be aesthetically unpleasant. Coal and petroleum generation causes environmental degradation in the form of carbon dioxide and toxic emissions, causing enormous adverse effects on natural weather cycles, having damaging effects on life as a whole in the planet, in the long run. Similarly, nuclear waste can be hazardous; disposing them is very expensive and also has ability to have an adverse effect on the environment.

Moreover, with all of these above mentioned circumstances of power generation and environmental adverse affects, the average user's ability to contribute to improve the situation is next to nothing. So, the average consumer is helpless regarding these issues. Scientists for long have known that earth's only major renewable resource, as far as life is concerned, is the energy coming from the sun. These and other limitations and deficiencies associated with the related art may be more fully appreciated by those skilled in the art after comparing such related art with various aspects of the present invention as set forth herein with reference to the figures.

BRIEF SUMMARY OF THE INVENTION

The present invention is directed to apparatus and methods of operation that are further described in the following Brief Description of the Drawings, the Detailed Description of the Invention, and the claims. Other features and advantages of the present invention will become apparent from the following detailed description of the invention made with reference to the accompanying drawings.

BRIEF DESCRIPTION OF THE DRAWINGS

FIG. 5 is a schematic block diagram illustrating construction of parallel solar panel boards in accordance with one or more embodiments of the present invention;

DETAILED DESCRIPTION OF THE DRAWINGS

Figure 1:
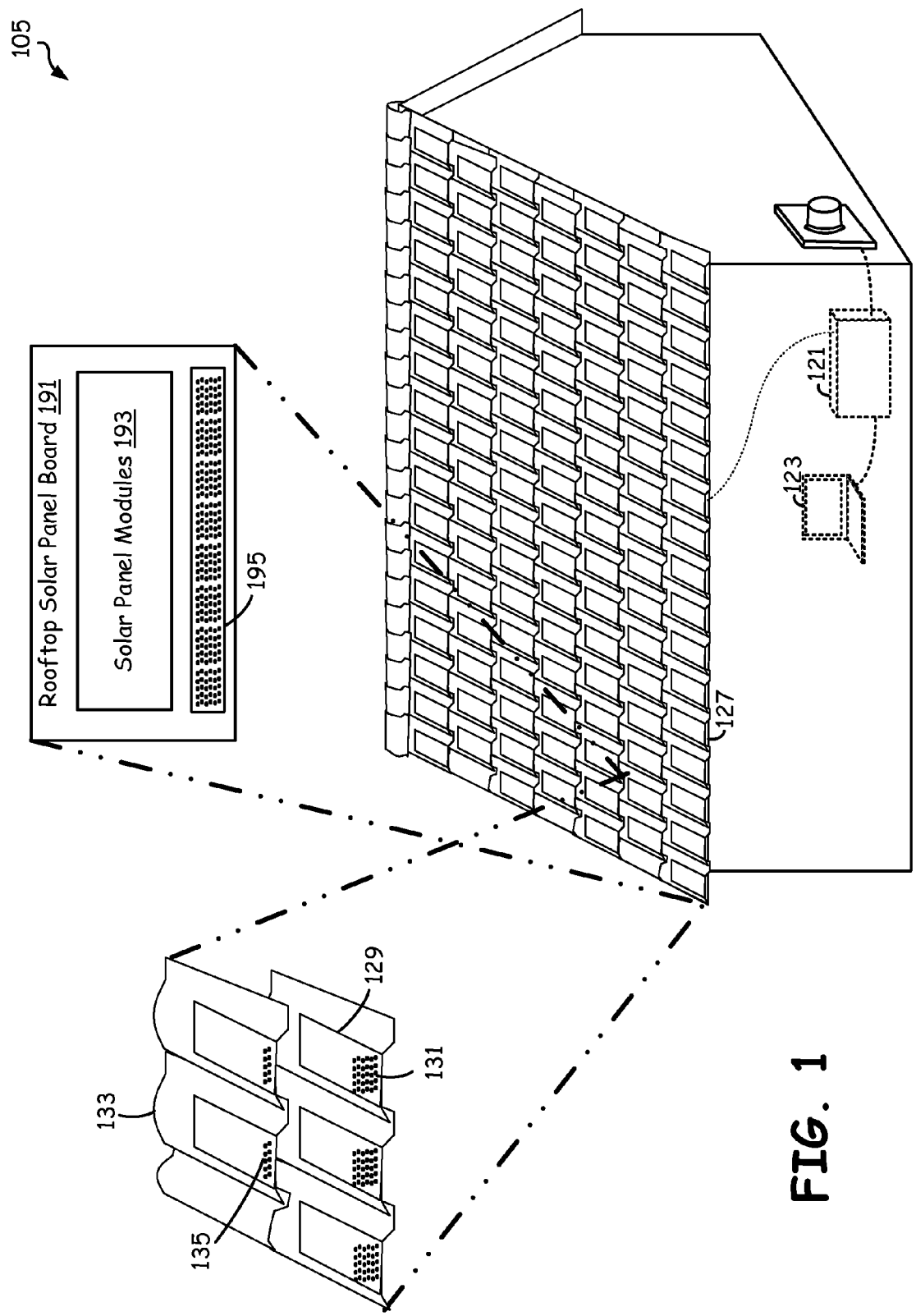
FIG. 1 is a system block diagram illustrating a solar panel generation system constructed and operating according to one or more embodiments of the present invention.

FIG. 1 is a system block diagram illustrating a solar panel generation system constructed and operating according to one or more embodiments of the present invention. The solar panel generation system 105 of FIG. 1 includes a plurality of solar panel boards (solar panels) that are arranged in a solar panel array. In a first embodiment of FIG. 1, the solar panel boards fit within roofing tiles 127 and 133 to form the array. In a second embodiment of FIG. 1, the solar panel boards 191 are not formed with the roofing tiles.

With the first embodiment, light sources 131 and 135 reside within a housing 129 of a roofing tile 133 that is part of a solar panel power generation system 105; wherein the housing 129 contains one or more photovoltaic panels, a solar panel control system (containing solar panel processing circuitry, solar panel communication and power interfaces, and solar panel memory and sensor modules). The housing 129 may also contain a heating assembly and an electrical rotational assembly among other modules. The solar panel power generation system 105 also contains a central control unit 121 with the light sources 131, 135 operable to produce a visible output based upon control of the solar panel processing circuitry and central control unit 121 that indicates operating condition of the roofing tile 133, displays colorful decorative light during holidays and displays advertisements.

The solar power generation system 105 is a house rooftop solar power generation system that incorporates photovoltaic panels within each of the roofing tiles 127, 133, generates electrical power and delivers the electrical power to the central control unit 121 (or power receiver) for storing and delivery to the house or to an external grid. The central control unit 121 coordinates and controls the functions of the entire solar power generation system 105. The solar panels, as previously described, may include a plurality of modules (only light sources are shown here, refer to the FIGS. 2 though 7 for details about other modules). Monitoring and controlling of the solar panels (including light sources) is done in accordance with software installed in the central control unit 121 and options set by the user in a computing system 123 that is associated with the central control unit 121. Alternatively, in conjunction with the central control unit 121, an external server (communicatively coupled via the Internet and/or other networks and operated remotely, for example) may monitor and control the functions of the entire solar power generation system 105, including displaying of holiday lights and advertisements. The display of lighting may be coordinated among multiple solar power generation systems 105 that are located on multiple roofs. The roofs may be on commercial buildings, stadiums, or other structures as well. For example, lighting of multiple solar panel generation systems may be controlled to jointly provide advertisements or decorative lighting.

Each of the roofing tiles 127, 133 contains a weather proof housing 129 in which the pluralities of modules are housed and sealed. These pluralities of modules, in addition to the most essential modules of photovoltaic panels, include, in various embodiments, one or more of solar panel control system (consisting of a solar panel processing circuitry, solar panel communications and power interface and solar panel memory), solar panel sensors, solar panel positional adjustment assembly, snow heater assembly, over heating and fire response modules, self cleaning rotational assembly and so forth. Some of these modules are mounted upon a solar panel while others may be located elsewhere, in a suitable location, within the housing 129 of each of the roofing tiles 127, 133. In specific, the photovoltaic panels are typically mounted on solar panels along with light sources 131, 135, but in some embodiments, the photovoltaic cells or light sources 131, 135 may be located elsewhere within the housing of each of the roofing tiles 127, 133 (refer to the descriptions of the FIGS. 3 through 7). All these modules are coordinated and controlled by the central control unit 121 to function efficiently, so the solar power generation system 105 generates electricity optimally in all weather conditions, and in all locations (that includes city locations, where neighborly high roofed building are common place).

In addition to all of the above mentioned modules and assemblies, housed within the housings 129 of all or some of the roofing tiles 127, 133 are light sources 131, 135 coupled to the corresponding solar panel processing circuitry. The light sources 131, 135 may be a matrix of individual lights (such as light emitting diodes), that operate based upon instructions from the central control unit 121 or the solar panel processing circuitry. The light sources 131, 135 may vary from roofing tile 127, 133 to roofing tile 127, 133, based upon functionalities, locations within the roof and cost considerations. The functionalities of the light sources 131, 135 include displaying the operating condition of the roofing tiles 127, 133, operating condition of the various modules within each of the roofing tiles 127, 133, displaying decorative holiday lighting and displaying advertisements. Some of the light sources 131, 135 within a roofing tile 127, 133 may have all of the above mentioned functionalities, while other may have only some of them.

For instance, the edge roofing tiles 127 may have significantly more light sources 131 that display decorative holiday lighting and display advertisements, while the light sources 135 in other roofing tiles 133 may only indicate operating condition of the individual roofing tiles and operating condition of the various modules within each of the roofing tiles 127, 133. The light sources 131, 135 are externally visible and may be multicolored, indicating good operating condition of each of the tiles, as well as faulty operating conditions in any of the roofing tiles (to draw attention of the users). The decorative holiday lighting and advertisement lighting sources 131 may have a large matrix of lights that essentially display colorful dancing decorative lights and advertisements (displaying moving characters, words and sentences as well as images, for instance) that can be controlled remotely from a computing system 123 or a remote server communicatively coupled to the central control unit 121. This is done by controlling individual light sources 131 within the matrix, to go on and off, in a preprogrammed manner, to create a sense of colorful lights or advertisement lights.

As mentioned above, the visible output of the light sources 131, 135 identify the solar panel or roofing tile 127, 133 (whose operating condition is faulty) among a plurality of solar panels or roofing tiles 127, 133 of the solar power generation system 105 and calls for user's attention (for maintenance). The operating condition of a roofing tile 127, 133, based upon which the lighting sources 131, 135 produce visible light, may include calling for attention of one or more of: (i) Maintenance of the housing; (ii) Cleaning of the housing; (iii) Solar panel positional adjustment; (iv) Photovoltaic panel functioning; (v) Solar panel processing circuitry, solar panel communications and power interface and solar panel memory functioning; (vi) Solar panel sensor functioning; (vii) Positional adjustment assembly functioning; (viii) Snow heater assembly functioning; (ix) Over heating and fire response modules functioning; and/or (x) Self cleaning rotational assembly functioning. Any of the above said problems, depending upon cleaning, maintenance, malfunctioning and so forth may be indicated by the light sources 131, 135, by producing externally visible lights, so that immediate attention can be provided; thereby making the solar power generation system 105 function efficiently, optimizing the electrical power generation and not give raise to any systemic failures.

In some embodiments, only one roofing tile 127, 133 in a block of roofing tiles 127, 133 may have light sources 135 that indicate the operating condition of the roofing tiles 127, 133 and operating condition of the various modules in the entire block, thus saving some cost and power consumed. The roofing tiles 127, 133, in this case, grouped into several blocks (that may be visible as a map in the computing system 123 attached to the central control unit 121, for easy identification) on the roofing of the house. For instance, each block may be made up of roofing tiles 127, 133 of one row or column of one panel of roofing, alternatively, the block may be made of a group of tiles in square or rectangular shape, containing certain number of roofing tiles 127, 133. While, each of these roofing tiles 127, 133 within a block may contain just one light source 135 that identifies the solar panel or roofing tile 127, 133 that has some problems, one roofing tile 127, 133 within the block may contain additional light sources 135 that indicates the exact nature of the problems (one or more of the problems listed in the above paragraph, for instance). Thus, the user, by combining the information of visible lights in the two roofing tiles 127, 133, one indicating the location, while the other indicating the exact nature of the problems, arrives at a conclusion on the nature and location of the problems. Thus, a roofing tile 127, 133 and nature of problem within the roofing tile 127, 133 is easily identified; that may include problems related to the maintenance, cleaning, rotation of the solar panel, malfunctioning of one or more of photovoltaic panels, solar panel control system (consisting of a solar panel processing circuitry, solar panel communications and power interface and solar panel memory), solar panel sensors, solar panel positional adjustment assembly, snow heater assembly, over heating and fire response modules, self cleaning rotational assembly and so forth.

Similarly, the decorative holiday light sources 131 and advertisement light sources 131 (a matrix of visible light emitting diodes, for instance, which displays colorful lights and advertisements, especially in city and suburban locations) may be located only in the few rows and/or columns of roofing tiles 127 that are at the edges of the roofing. They may display decorative lights during the holiday seasons, parties or other family functions, and the entire combined set of light sources 131, 135 of all of these roofing tiles 127, 133 may be coordinately lighted. Similarly, the advertisements may be displayed by coordinating the light sources 131 of entire combined set of light sources 131 of all of these roofing tiles 127, for instance, in last few edge rows of the front roofing that faces a road. By combining and coordinating the entire sets of light sources 131 as a single display, there is more room for maneuverability and displaying of entire sentences, images, art works and cartoons are possible, thus attracting more passing by people's attention.

The operating of the light sources 131, 135 in a solar power generation system 105 having a plurality of solar panels in control of a central control unit 121, is done directly by the central control unit 121, and in case the solar panel processing circuitry is installed, then, in conjunction with the solar panel processing circuitry and solar panel memory, via respective communication interfaces. The light sources 131, 135 derive power from the photovoltaic panels, via a power interface.

In another embodiment, the solar panel power generation system 105 may consist of a separate rooftop structure (instead of housing inside the roofing tiles) that contains a large rooftop solar panel board 191, containing many solar panel modules 193 (such as the photovoltaic panels, solar panel processing circuitry, solar panel communications and power interface, solar panel memory, solar panel sensor modules containing a number of individual sensors, solar panel positional adjustment assembly, snow heater assembly, over heating and fire response modules, and/or self cleaning rotational assembly functioning) and the light sources 195 placed separately within the rooftop solar panel board 191 or separately from it. The light sources 195 containing matrix of many individual light sources perform the same functions mentioned in the above paragraphs (that include displaying working conditions of the modules of the rooftop solar panel board 191, problems with maintenance, cleaning, positional adjustments, displaying decorative holiday lights and advertisements).

For example, a user who wishes to install a solar power generation system 105 may decide to do so in consultation with a supplier, based upon many considerations that include amount of power to be generated, and cost considerations. In addition, when it comes to light source 131, 135 installations, the user may make many compromises based upon location of the house (in a city or suburb, in front of a major road with many passersby and so forth), cost of the system, willingness of the promoters to advertise (for instance, from a remote server) and so forth. The user may opt one of many possibilities, with regards to the installation of the light sources 131, 135 that include: (i) Installing just one light source 135 in each of the roofing tile 127, 133 that indicates only a malfunctioning; (ii) Same as (i), except that one or more roofing tiles 127, 133 (say, one in a block of roofing tiles 127, 133) may contain more light sources 135 that indicate the nature of the problem; (iii) Installing light sources 135 that indicate the nature and location of the problem in each of the roofing tiles 127, 133; (iv) Installing, in addition to the (i), (ii) or (iii), decorative and advertising light sources 131 in few roofing tiles, especially, at the edges (alternatively, they might be placed as a group at the center of the roofing); and/or (v) Installing, in addition to the (i), (ii) or (iii), decorative and advertising light sources 131 in all of the roofing tiles.

Figure 2:
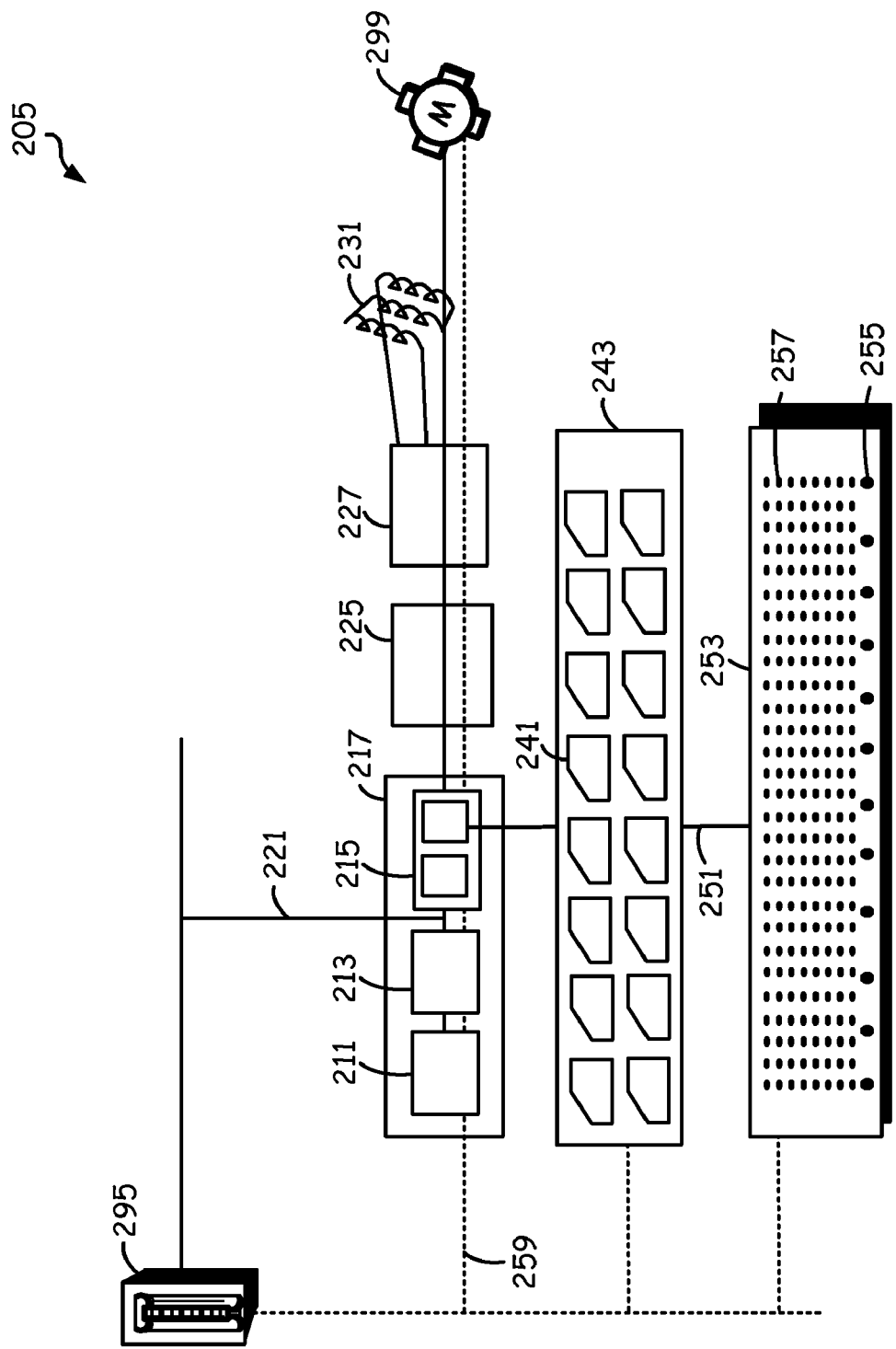
FIG. 2 is a schematic block diagram illustrating components of one or more solar panels of a solar panel generation system constructed and operating according to one or more embodiments of the present invention.

FIG. 2 is a schematic block diagram illustrating components of one or more solar panels of a solar panel generation system constructed and operating according to one or more embodiments of the present invention. In particular, FIG. 2 illustrates interconnections between a solar panel control system 217, heater assembly 227, 231, electrical rotational assembly 299, overload and fire response module 225, light sources 253, all of which are placed within the housing of the roofing tile. The components and modules depicted in the illustration include modules of solar panel control system 217 (consisting of a solar panel processing circuitry 211, solar panel communications and power interface 215 and solar panel memory 213), solar panel sensors 243, solar panel positional adjustment assembly 299, snow heater assembly 227, 231, over heating and fire response modules 225, light sources 253 and connectors 295. The photovoltaic panels and self cleaning rotational assembly are not depicted here.

These modules or assembly (solar panel control system 211, 215 and 213, solar panel sensors 243, solar panel positional adjustment assembly 299, snow heater assembly 227, 231, light sources 253 and over heating and fire response modules 225) are powered by one or more of solar panel power buses 221, 251 that derive power from the photovoltaic panels (or remotely) and deliver power to the individual modules via the solar panel power interface 215. Similarly, the communication between the individual modules (of solar panel sensors 243, solar panel positional adjustment assembly 299, snow heater assembly 227, 231, light sources 253 and over heating and fire response modules 225) and the solar panel control system 217, central control unit (121 of the FIG. 1) is made possible via communication buses (that includes one or more of solar panel communication buses such as 259).

The light sources 253 are made up of a matrix of individual lights sources 257 (such as light emitting diodes) and also one more set of working condition indicating lights sources 255. The lights sources 255 indicate working condition of the various modules such as the photovoltaic panels, solar panel sensors 243, solar panel positional adjustment assembly 299, snow heater assembly 227, 231, over heating and fire response modules 225, and self cleaning rotational assembly. A good working condition may be indicated with a green light or no lights at all (to save power) while a bad working condition may be indicated by a red light, in one of the light sources 255. The operating condition indicated by the light sources 255 may include one or more of problems related to the maintenance of the housing, cleaning of the housing and solar panel positional adjustment. Also, in addition, they may include good or bad working conditions of photovoltaic panels, solar panel processing circuitry 211, solar panel communications and power interface 215, solar panel memory 213, solar panel sensors 243 (containing a number of individual sensors 241), positional adjustment assembly 299, snow heater assembly 227, 231, over heating and fire response modules 225, and/or self cleaning rotational assembly functioning.

In addition, the matrix of lights sources 257 may display holiday decorative lighting and/or advertisements. They are controlled by the central control unit, based upon the software installed and the options set by the user. They may also be controlled by an external server, located remotely and communicatively coupled via internet; for instance, by an advertisement agency which pays the user for the usage of the advertisement panels such as 257 in plurality of the roofing tiles.

Figure 3:
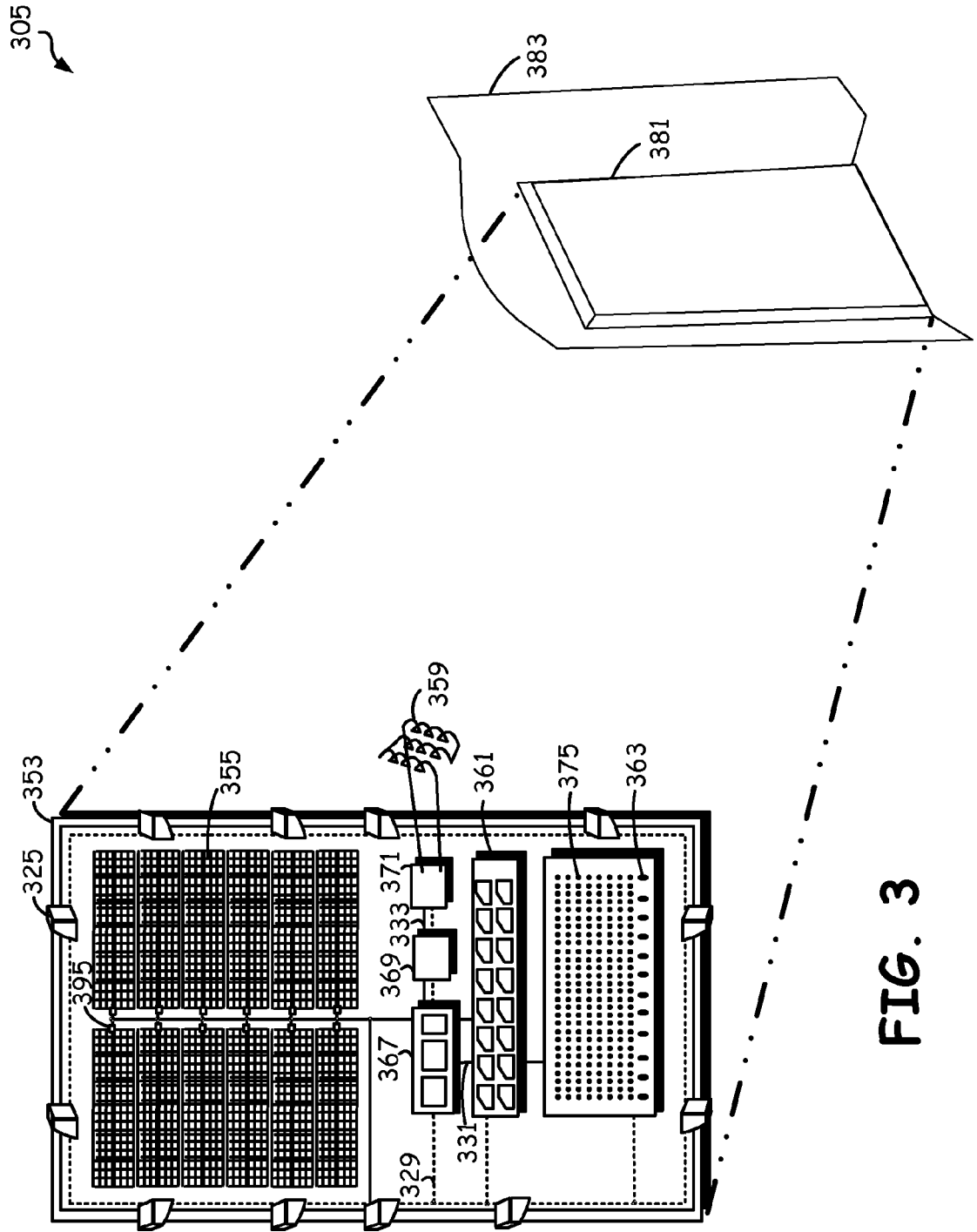
FIG. 3 is a schematic block diagram illustrating construction of a solar panel board that contains light sources 1 in accordance with at least one embodiment of the present invention.

FIG. 3 is a schematic block diagram illustrating construction of a solar panel board that contains light sources in accordance with at least one embodiment of the present invention. The solar panel board 353 (solar panel) contains light sources 375, 363, each of which may include a matrix of individual lights communicatively coupled to the solar panel processing circuitry module 367 (consisting of solar panel processing circuitry, solar panel communication and power interfaces, solar panel memory), heater assembly 371, 359, sensor module 361 and central control unit (via the processing circuitry), in accordance with an embodiment of the present invention. In specific, the depiction shows light sources 375 and 363 that are mounted on a solar panel board 353 along with other modules such as the solar panel processing circuitry module 367 (consisting of solar panel processing circuitry, solar panel communication and power interfaces, solar panel memory), heater assembly 371, 359 (only part of it being mounted on the solar panel board 353 while the other part may be mounted behind glass sealing), sensor module 361, photovoltaic panels 355, solar panel bus drivers 395, over heating and fire response modules 369 and connectors 323, 325. The solar panel board 353 is placed within the housing 381 of the roofing tile 383 and sealed by protective covering 381.

The solar panel control system 367, solar panel sensors 361, solar panel positional adjustment assembly (not shown here), snow heater assembly 371, 359, light sources 375, 363 and over heating and fire response modules 369 are powered by one or more of onboard solar panel power buses 331, 333 that derive power from the photovoltaic panels 355 and deliver the power to the individual modules via the solar panel power interface. Similarly, the individual modules of solar panel control system 367, solar panel sensors 361, solar panel positional adjustment assembly, snow heater assembly 371, 359, light sources 375, 363 and over heating and fire response modules 369 are communicatively coupled via communication buses such as 329.

The operating condition displaying light sources 363 and decorative holiday and advertisements display lights sources 375 are visible externally via the glass upper sealing. As a combined single light sources matrices 375 in pluralities of roofing tiles 383, they display holiday decorative lights and advertisements in a coordinated fashion, to attract attention of people in the surrounding areas.

In another embodiment of the FIG. 3, the solar panel board 353 may be placed separately on the rooftop (instead of placing within the roofing tiles) via appropriate mounting hardware. The solar panel board 353 may be one of a plurality of solar panel boards of the solar power generation system. The solar panel components may contain most of the elements illustrated such as the photovoltaic panels 355, solar panel power bus drivers 395, solar panel control system 367 (containing solar panel processing circuitry, solar panel communications and power interface and solar panel memory), solar panel sensor modules 361, solar panel positional adjustment assembly, snow heater assembly 371, 359, over heating and fire response modules 369 self cleaning rotational assembly functioning, solar panel power buses 331, 333, solar panel communication buses 329 and/or light sources 363, 375. In this case, the light sources 363, 375 perform the same functions of displaying working conditions of the modules of the solar panel board 353, problems with maintenance, cleaning, positional adjustments, displaying decorative holiday lights, and advertisements. Similar considerations apply to the embodiments of the FIGS. 4 through 7.

Figure 4:
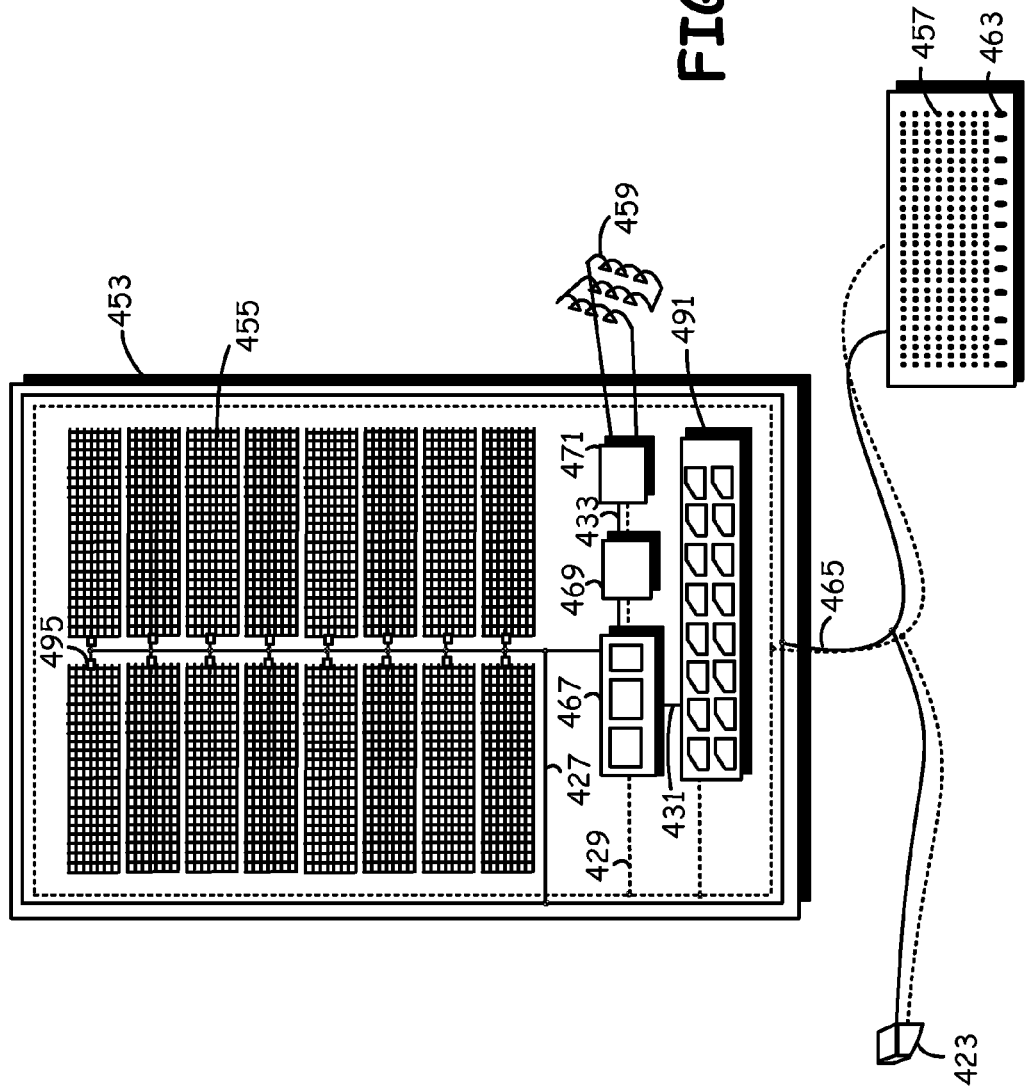
FIG. 4 is a schematic block diagram illustrating construction of solar panel board and separate light sources in accordance with at least one embodiment of the present invention.

FIG. 4 is a schematic block diagram illustrating construction of solar panel board (solar panel) and separate light sources in accordance with at least one embodiment of the present invention. The solar panel board 453 and separate light sources 457, 463 may reside in separate housings in the embodiment of FIG. 3, i.e., the light sources 463 and 457 placed separately from the solar panel board 453. The light sources 463, 457 are located so that they are visible externally.

The solar panel board 453 contains elements of the solar panel power generation system such as the photovoltaic panels 455, solar panel power bus drivers 495, solar panel control system 467, snow heating assembly 471, 459, overload protection and fire response module 469 and sensor module 491. These modules within the solar panel board 453 and outside (solar panel control system 467, solar panel sensors 491, solar panel positional adjustment assembly—not shown here, snow heater assembly 471, 459 and over heating and fire response modules 469) are powered by one or more of solar panel power buses 427, 433, 431, built into the solar panel board 453, that derive power from the photovoltaic panels 455 and deliver to the individual modules via the solar panel power interface. Similarly, the individual modules of solar panel control system 467, solar panel sensors 491, solar panel positional adjustment assembly, snow heater assembly 471, 459 and over heating and fire response modules 469 are communicatively coupled via communication buses such as 429.

The light sources 457, 463 that are placed separately are powered via an external wiring 465 that is attached to the onboard solar panel power buses 431, 433. Similarly, light sources 457, 463 are communicatively coupled to the solar panel control system 467 via the external wiring 465 that is attached to the onboard solar panel communication bus 429. Connector 423 that couples to external wiring 465 may couple to other lighting and/or other panel(s).

In some embodiments, pluralities of light sources 457, 463 may be placed together and away from the housing of the roofing tiles and sealed in a single transparent container to be externally visible. This single set of matrices of light sources 457, 463 may advertise and display holiday decorative lights, all in one place. These matrices of light sources 457, 463 may be placed in a suitable location at the roof top that is visible to all passersby outside the house. They might be controlled directly by the central control unit or an external server (that belongs to an advertising agency, for instance).

FIG. 5 is a schematic block diagram illustrating construction of parallel solar panel boards in accordance with one or more embodiments of the present invention. The solar panel boards 505 of FIG. 5 include two boards 553 and 589 that are mounted one on top of another. The top board 553 includes light sources 561, 563 that are communicatively coupled to a solar panel control system 567, heater assembly 571, 559, electrical rotational assembly, sensor module 591, overload and fire response module 569, of the bottom board 589. In effect, this illustration depicts an embodiment of a solar panel of a solar panel power generation system with which components of the solar panel are separated in to a top board and a bottom board.

Most of the modules and assemblies are mounted upon one of the two parallel solar panel boards 553, 589, while some others, due to their functionalities, are placed external to the solar panel boards 553, 589; but within the housing of the roofing tile. The top solar panel board 553 contains only those components and assemblies that by their functionality should be exposed to the light or be externally visible. They include photovoltaic panels 555 (and corresponding solar panel power bus drivers 595) and light sources 563, 561. The light sources 563, 561 may derive power directly from the photovoltaic panels 555, via the corresponding solar panel power bus drivers 595 and onboard solar panel power buses 527 (as illustrated), or may derive power from the photovoltaic panels 555 via the solar panel power interfaces (not illustrated).

The bottom solar panel board 589 may contain most of the other modules and assemblies that include solar panel control system 567, snow heating assembly 571, 559, overload protection and fire response module 569 and sensor module 591. These modules within the bottom solar panel board 589 and outside (solar panel control system 567, solar panel sensors 591, solar panel positional adjustment assembly—not shown here, snow heater assembly 571, 559 and over heating and fire response modules 569 are powered via one or more of solar panel power buses 527, 585, 581 and 533 (built into the solar panel boards 553, 589, that derive power from the photovoltaic panels 555 and deliver to the individual modules via the solar panel power interface). Similarly, the individual modules of solar panel control system 567, solar panel sensors 591, solar panel positional adjustment assembly, snow heater assembly 571, 559 and over heating and fire response modules 569 are communicatively coupled via communication buses such as 529, 583, and 533.

As mentioned in the previous two embodiments of the FIGS. 3 and 4, the light sources 561, 563 display working condition of the modules and assembly within the housing as well as decorative holiday lighting and advertisements. The light sources 563 display many working conditions that include problems with the housing maintenance, cleaning and the solar panels rotational adjustments, one or more of modules of the solar panel control system 567, solar panel sensors 591, solar panel positional adjustment assembly—not shown here, snow heater assembly 571, 559, over heating and fire response modules 569, photovoltaic panels 555 and solar panel power bus drivers. The matrix of lights sources 561 display colorful holiday lights and advertisements.

Figure 6:
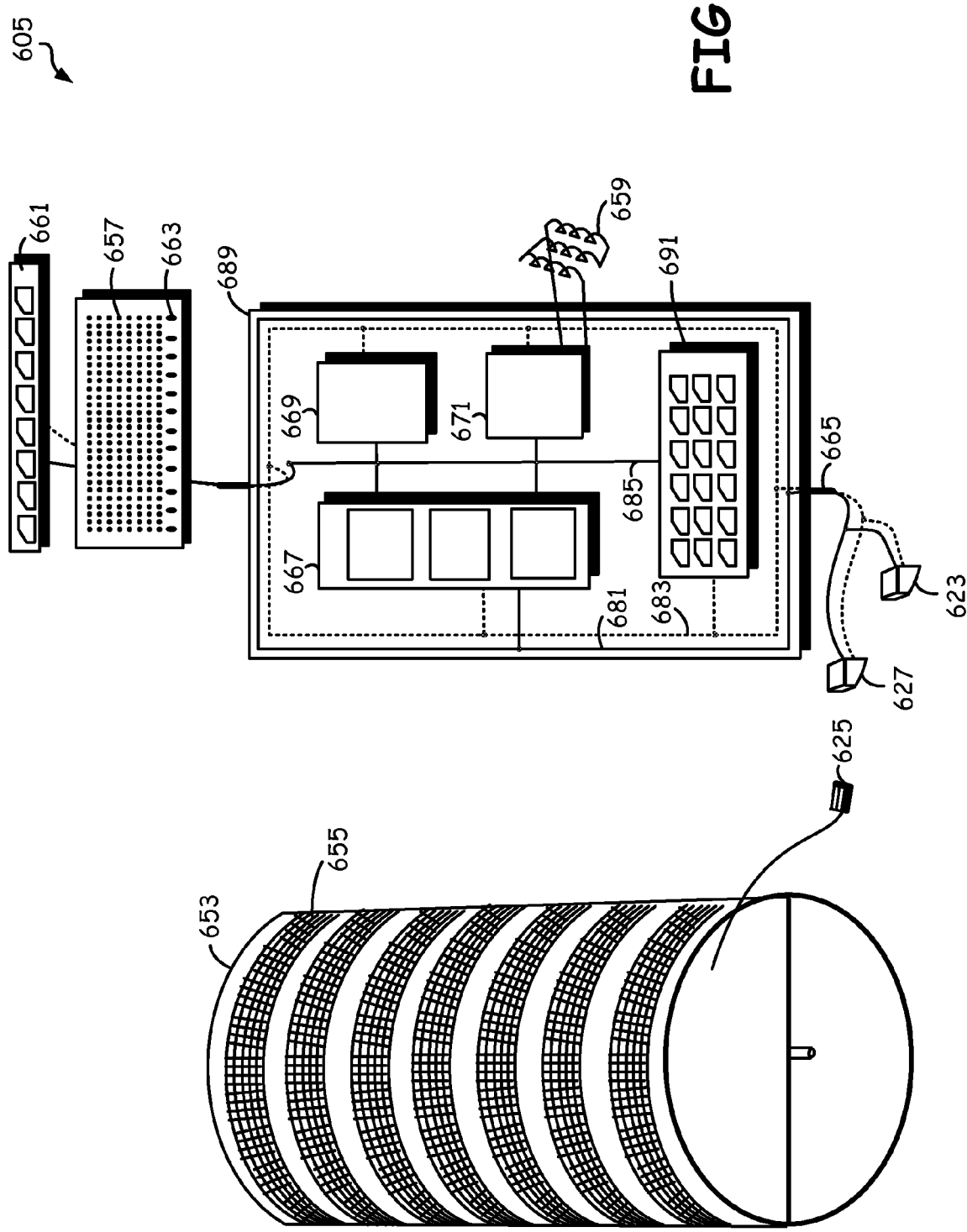
FIG. 6 is a schematic block diagram illustrating still another embodiment of a solar panel constructed according to one or more embodiments of the present invention.

FIG. 6 is a schematic block diagram illustrating still another embodiment of a solar panel constructed according to one or more embodiments of the present invention. The elements 605 of FIG. 6 are contained within a housing (not explicitly shown) and include a cylindrical photovoltaic panel 655, solar panel board 689 and separately mounted light sources 657, 663, wherein the light sources 657, 663 are communicatively coupled to the solar panel control system 667. A self cleaning system, heater assembly 671, 659, electrical rotational assembly, overload and fire response module 669 are also included. This specific embodiment of FIG. 6 may be used in conjunction with a roofing tile that has a cylindrical housing built into it.

The photovoltaic panels 655 and solar panel bus drivers are mounted upon the top of the cylindrical cylinder 653 (that rotates on an axis with help of a motor, and cleans itself while moving through a brush mounted within housing). The photovoltaic panels 655 are electrically connected to the solar panel board 689 via an external wiring 665 and connectors 625, 627, and 623.

The solar panel board 689 may be placed at the center of the cylinder 653 and contain most of the assembly and modules that do not require exposure to the sunlight or be visible externally, such as the solar panel control system 667, self cleaning system, heater assembly 671, overload and fire response module 669 and some of the sensors 691. They are powered by the photovoltaic panels 655, via the solar panel power bus drivers, the solar panel power interfaces and onboard and solar panel buses such as 681, 685, while communications between them occur via onboard solar panel communication buses such as 683.

Modules and assemblies of the solar panel board 689, including some parts of the heating assembly 659, rotational assembly, light sources 657, 663 and some of the sensors 661 are placed within the housing, but external to the solar panel board 689. They may be powered by external wirings that are attached to the onboard solar panel power buses 681, 685 and communicatively coupled to the modules of the solar panel board 689 via external wirings that are attached to the onboard solar panel communication buses 683. An external connector 623 connects the roofing tile power generation system to the central control unit.

As in the case of prior embodiments of the FIGS. 3, 4, and 5, the light sources 663 and/or 657 display working conditions including housing maintenance, cleaning and solar panels rotational adjustments problems and problems with one or more of modules of the solar panel control system 667, solar panel sensors 691, solar panel positional adjustment assembly—not shown here, snow heater assembly 671, 659, over heating and fire response modules 669, photovoltaic panels 655 and solar panel power bus drivers. The matrix of lights sources 657 may display colorful holiday lights and advertisements.

Figure 7:
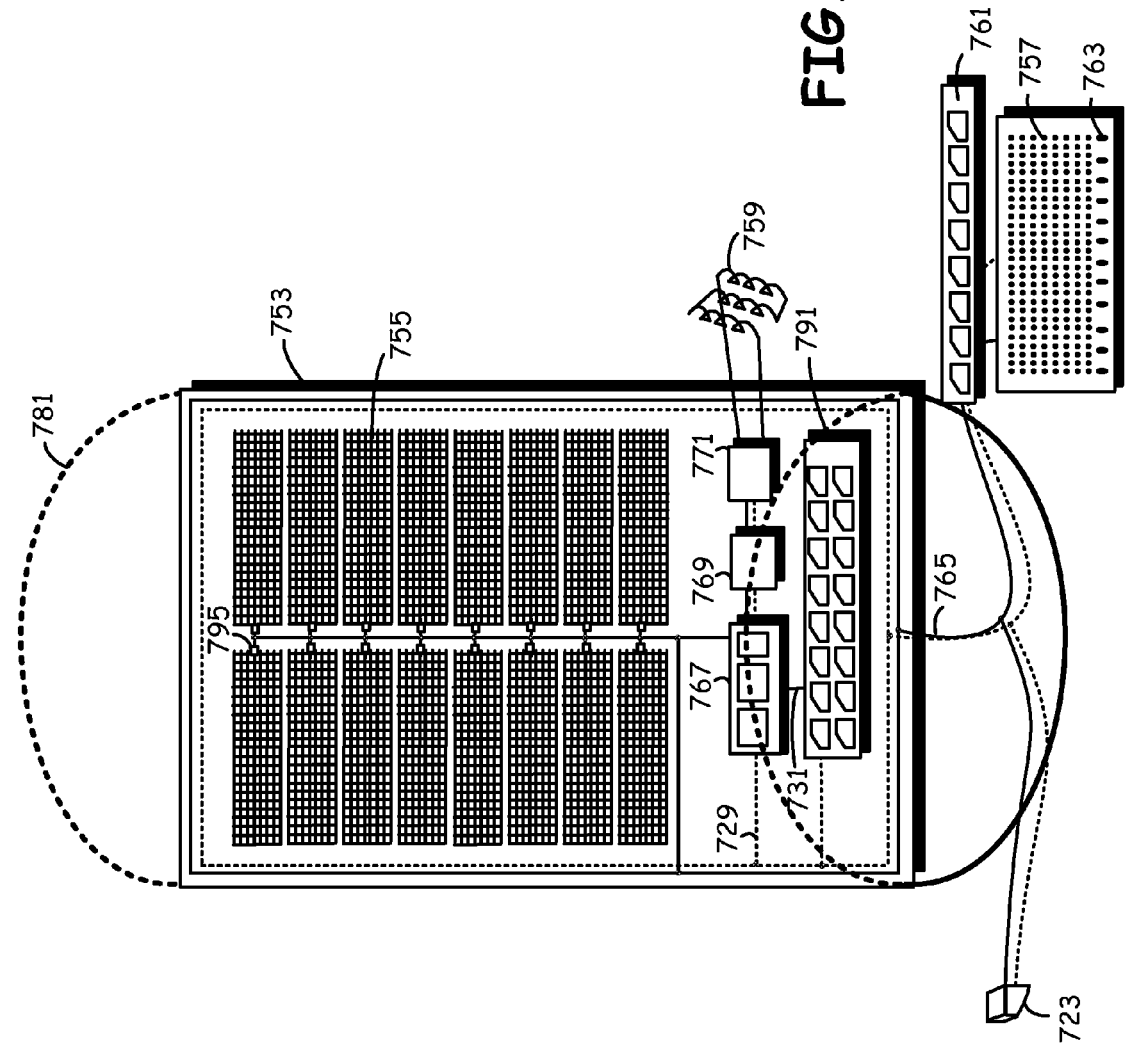
FIG. 7 is a schematic block diagram illustrating construction of a solar panel board placed in a self cleaning glass cylinder system and separately mounted light sources according to one or more embodiments of the present invention.

FIG. 7 is a schematic block diagram illustrating construction of a solar panel board placed in a self cleaning glass cylinder system and separately mounted light sources according to one or more embodiments of the present invention. The elements of FIG. 7 include solar panel board 753 placed in a self cleaning glass cylinder system 781 and separately mounted light sources 757, 763; wherein the light sources 757, 763 are communicatively coupled to the solar panel control system 767, sensor module 791, self cleaning system, heater assembly 771, 759, electrical rotational assembly, overload and fire response module 769. This specific embodiment may be used in conjunction with a roofing tile that has a cylindrical housing built into it. Alternately, this embodiment may be deployed as one solar panel of an array of solar panels that mount upon a surface such as a house roof, office building roof, stadium roof, pole mounted system, etc.

This embodiment of the illustration is similar to that of the FIG. 4, except that the solar panel board 753 is mounted at the center of a self cleaning glass cylinder 781. Most of the modules and assembly such as the photovoltaic panels 755, solar panel bus drivers 795, solar panel control system 767, overheating and fire response assembly 769, parts of the heater assembly 771 and parts of the sensor module 791 are placed on the solar panel board 753 and are powered by onboard solar panel buses such as 733, 731, via the solar panel power interfaces and are communicatively coupled to each other via the solar panel communication interfaces via the solar panel communication buses such as 729.

The light sources 757, 763 and some parts of the sensor module 761 are placed outside the solar panel board 753, but within the housing of the roofing tile; and are electrically and communicatively coupled to the solar panel board 753 via external wirings 765. An external connector 723 connects the roofing tile power generation system to the central control unit.

The light sources 763 display problems related to the housing maintenance, cleaning and solar panels rotational adjustments, solar panel control system 767, solar panel sensors 791, 761 solar panel positional adjustment assembly—not shown here, snow heater assembly 771, 759, over heating and fire response modules 769, photovoltaic panels 755 and solar panel power bus drivers 795. The matrix of lights sources 757 display colorful holiday lights and advertisements.

Figure 8:
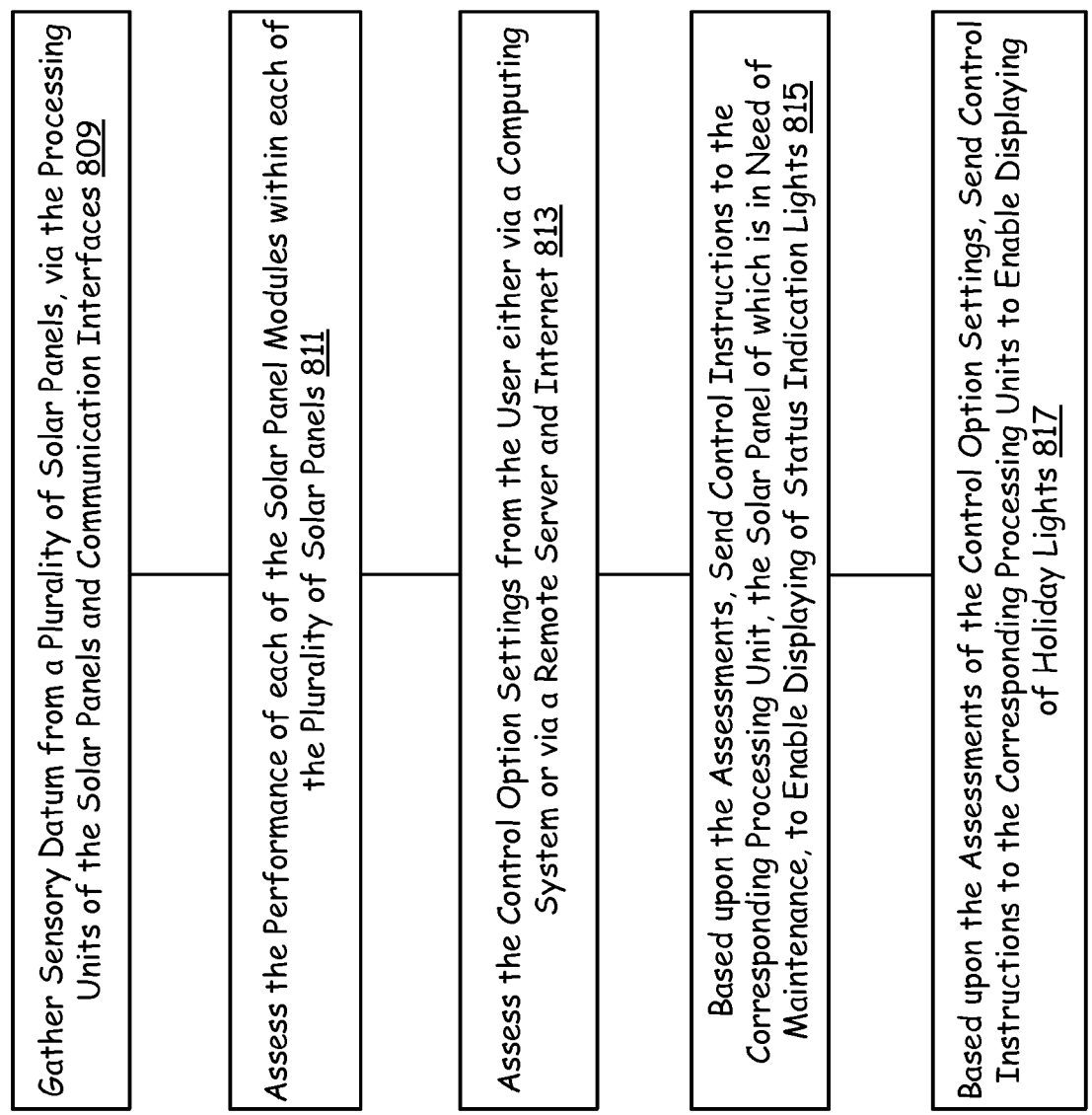
FIG. 8 is a flow chart illustrating operation of a central control unit and at least one solar panel of the solar panel power generation system of FIG. 1 according to one or more embodiments of the present invention.

FIG. 8 is a flow chart illustrating operation of a central control unit and at least one solar panel of the solar panel power generation system of FIG. 1 according to one or more embodiments of the present invention. Operation 805 begins at a block 809, when the central control unit gathers from the pluralities of solar panel memories, via the corresponding solar panel processing circuitry (or directly), communication interfaces and communication buses (or wireless communication interfaces), the stored sensory datum from the corresponding solar panels.

At a next block 811, the central control unit assesses the performance of each of the solar panel modules within each of the solar panels, based upon the gathered sensory data. This sensory datum may indicate problems with the maintenance, cleaning, positional adjustments of the solar panel boards, solar panel control module (consisting of solar panel processing circuitry, solar panel communication and power interfaces, solar panel memory), photovoltaic panels, solar panel bus drivers, overheating and fire response assembly, heater assembly, solar panel positioning assembly and sensor module, of a corresponding solar panel.

At a next block 813, the central control unit assesses the control option settings done by the user in the installed software either via a nearby associated computing system or via a remote server and Internet. Based upon the assessments in the blocks 811 and 813, the central control unit, at a next block 815, sends control instructions to the corresponding processing unit of the solar panel that requires attention, to enable display of the light sources that indicate these problems appropriately and visibly. Then, at a final block 817, based upon the assessments in the blocks 811 and 813, the central control unit sends control instructions to the corresponding processing unit to enable the displaying of the holiday and/or advertisement lights (for which the settings of the block 813 might be done remotely by an advertising agency, for instance).

Figure 9:
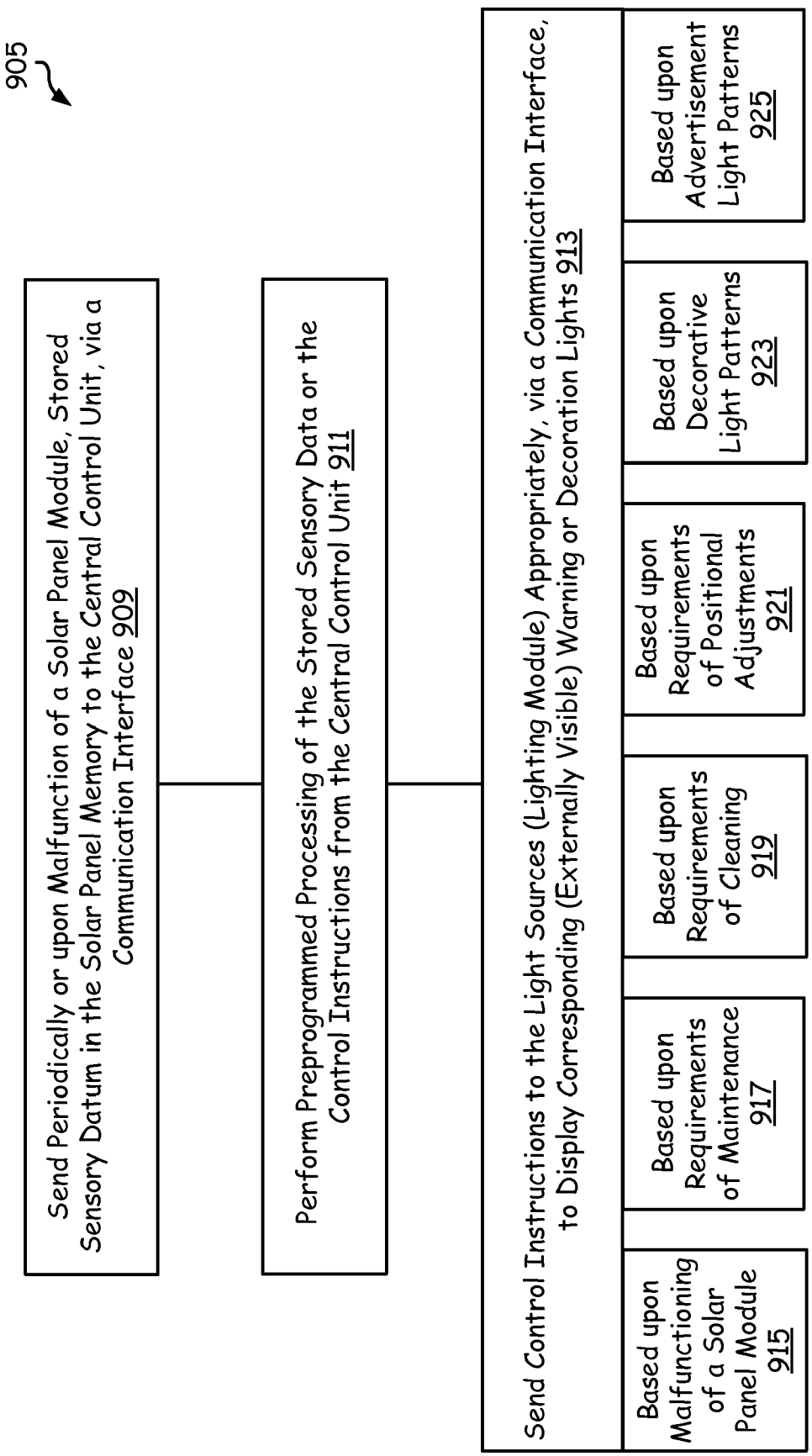
FIG. 9 is a flow chart illustrating operation of solar panel processing circuitry and light sources of the solar panel generation system of FIG. 1 according to one or more embodiments of the present invention.

FIG. 9 is a flow chart illustrating operation of solar panel processing circuitry and light sources of the solar panel generation system of FIG. 1 according to one or more embodiments of the present invention. Operation 905 begins at a block 909 when the solar panel processing circuitry sends sensory datum stored in the solar panel periodically, or as programmed; and also when a problem occurs with regards to a solar panel module, maintenance, cleaning or positional adjustments (if programmed so).

Next, the solar panel processing circuitry, at a next block 911, performs preprogrammed processing upon the stored sensory datum or executes the received instructions from the central control unit, based upon the processing of the block 909. At a next block 913, the solar panel processing circuitry sends control instructions to the light sources appropriately, via a communication interface, to display (externally visible) lights of warning, decorative or advertising lights; based upon one or more of the events occurring at blocks 915, 917, 919, 921, 923 and 925.

The events that may occur at any time include: (i) At the block 915, malfunctioning of one or more of a solar panel module such as the solar panel control module (consisting of solar panel processing circuitry, solar panel communication and power interfaces, solar panel memory), photovoltaic panels, solar panel bus drivers, overheating and fire response assembly, heater assembly, solar panel positioning assembly and sensor module; (ii) At the block 917, maintenance related problems; (iii) At the block 919, cleaning related problems; (iv) At the block 921, positional adjustments of the solar panel board related problems; (v) At the block 923, holiday decorative lights options set by a user; and (vi) At the block 925, advertisements lights options set by a user.

The terms "circuit" and "circuitry" as used herein may refer to an independent circuit or to a portion of a multifunctional circuit that performs multiple underlying functions. For example, depending on the embodiment, processing circuitry may be implemented as a single chip processor or as a plurality of processing chips. Likewise, a first circuit and a second circuit may be combined in one embodiment into a single circuit or, in another embodiment, operate independently perhaps in separate chips. The term "chip," as used herein, refers to an integrated circuit. Circuits and circuitry may comprise general or specific purpose hardware, or may comprise such hardware and associated software such as firmware or object code.

As one of ordinary skill in the art will appreciate, the terms "operable coupled" and "communicatively coupled," as may be used herein, include direct coupling and indirect coupling via another component, element, circuit, or module where, for indirect coupling, the intervening component, element, circuit, or module does not modify the information of a signal but may adjust its current level, voltage level, and/or power level. As one of ordinary skill in the art will also appreciate, inferred coupling (i.e., where one element is coupled to another element by inference) includes direct and indirect coupling between two elements in the same manner as "operable coupled" and "communicatively coupled."

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention.

One of average skill in the art will also recognize that the functional building blocks, and other illustrative blocks, modules and components herein, can be implemented as illustrated or by discrete components, application specific integrated circuits, processors executing appropriate software and the like or any combination thereof.

Moreover, although described in detail for purposes of clarity and understanding by way of the aforementioned embodiments, the present invention is not limited to such embodiments. It will be obvious to one of average skill in the art that various changes and modifications may be practiced within the spirit and scope of the invention, as limited only by the scope of the appended claims.

The invention claimed is:

1. A solar panel of a solar power generation system, the solar panel configured to be coupled to another one of a plurality of solar panels, both the solar panel and the another one of a plurality of solar panels including a number of light sources, the solar panel comprising:
  a housing;
  a photovoltaic panel disposed within the housing;
  a solar panel control system disposed within the housing comprising:
    solar panel processing circuitry;
    a solar panel communications interface;
    solar panel memory; and
  one or more additional light sources, in addition to the number of light sources, coupled to the solar panel processing circuitry and operable to:
    produce a visible output, based upon control of the processing circuitry, the visible output configured to indicate a status of the another one of the plurality of solar panels.

2. The solar panel of claim 1, wherein the visible output communicates an operating condition of the another one of the plurality of solar panels.

3. The solar panel of claim 2, wherein the operating condition of the another one of the plurality of solar panels comprises an indication that the housing of the another one of the plurality of solar panels requires maintenance.

4. The solar panel of claim 2, wherein the operating condition of the another one of the plurality of solar panels comprises an indication that the housing of the another one of the plurality of solar panels requires cleaning.

5. The solar panel of claim 2, wherein the operating condition of the another one of the plurality of solar panels comprises an indication that the another one of the plurality of solar panels requires positional adjustment.

6. The solar panel of claim 1, wherein the one or more additional light sources comprises a plurality of externally visible lights.

7. The solar panel of claim 6, wherein the at least some of the plurality of externally visible lights comprise light emitting diodes.

8. The solar panel of claim 6, wherein the visible output comprises holiday lighting.

9. The solar panel of claim 6, wherein the visible output comprises an advertisement.

10. The solar panel of claim 1, wherein the visible output based upon control of the processing circuitry is produced based upon direction received from a central control unit coupled to the solar panel by the solar panel communications interface.

11. A solar power generation system comprising:
  a first solar panel and a plurality of second solar panels, each comprising:
    a housing;
    a photovoltaic panel disposed within the housing;
    a solar panel control system disposed within the housing comprising:
      solar panel processing circuitry;
      a solar panel communications interface;
      solar panel memory; and
      one or more first light sources coupled to the solar panel processing circuitry, the first solar panel additionally comprising one or more additional light sources coupled to the solar panel processing circuitry; and
  a central control unit communicatively coupled to at least some of the plurality of solar panels via respective solar panel communications interfaces;
  wherein the one or more additional light sources of the first solar panel operable to:
    produce visible output, based upon control of at least one of the central control unit and respective solar panel processing circuitry, to indicate a status of at least one of the plurality of second solar panels.

12. The solar power generation system of claim 11, wherein the visible output produced by the first solar panel communicates an operating condition of the at least one of the plurality of second solar panels.

13. The solar power generation system of claim 12, wherein the operating condition of the at least one of the plurality of second solar panels comprises an indication that the housing of the at least one of the plurality of second solar panels requires maintenance.

14. The solar power generation system of claim 12, wherein the operating condition of the at least one of the plurality of second solar panels comprises an indication that the housing of the at least one of the plurality of second solar panels requires cleaning.

15. The solar power generation system of claim 12, wherein the operating condition of the at least one of the plurality of second solar panels comprises an indication that the at least one of the plurality of second solar panels requires positional adjustment.

16. The solar power generation system of claim 11, wherein the one or more first light sources comprises a plurality of externally visible lights.

17. The solar power generation system of claim 16, wherein the at least some of the plurality of externally visible lights comprise light emitting diodes.

18. The solar power generation system of claim 16, wherein the visible output of the first solar panel and the plurality of second solar panels together comprises holiday lighting.

19. The solar power generation system of claim 16, wherein the visible output of the first solar panel and the plurality of second solar panels together comprises an advertisement.

20. A method for operating a solar power generation system having a first solar panel and a plurality of second solar panels in control of a central control unit, the first solar panel including at least one light source, the method comprising:
  the central control unit communicating with the plurality of solar panels via respective communication interfaces; and the central control unit individually directing the at least one light source of the first solar panel operable to produce a visible output that identifies a status of at least one of the plurality of second solar panels.

21. The method of claim 20, wherein the visible output produced by the first solar panel communicates an operating condition of the at least one of the plurality of second solar panels.

22. The method of claim 21, wherein the operating condition of the at least one of the plurality of second solar panels comprises an indication that a housing of the at least one of the plurality of second solar panels requires maintenance.

23. The method of claim 21, wherein the operating condition of the at least one of the plurality of second solar panels comprises an indication that a housing of the at least one of the plurality of second solar panels requires cleaning.

24. The method of claim 21, wherein the operating condition of the at least one of the plurality of second solar panels comprises an indication that the at least one of the plurality of second solar panels requires positional adjustment.

25. The method of claim 21, wherein the at least one light source comprises a plurality of externally visible lights.

26. The method of claim 20, further comprising forming a visible light pattern by light sources of the plurality of second solar panels.

27. The method of claim 26, wherein the visible light pattern comprises holiday lighting.

28. The method of claim 26, wherein the visible light pattern comprises an advertisement.

29. The solar panel of claim 1, wherein the quantity of additional light sources coupled to the solar panel is dependent upon a functionality of the solar panel that is different from a functionality of the another one of the plurality of solar panels.

30. The solar power generation system of claim 11, wherein a quantity of light sources included in the first solar panel depends upon a functionality of the first solar panel that is different from a functionality of the second solar panels of the plurality of second solar panels.

31. The method of claim 20, wherein a quantity of light sources included in the first solar panel further depends upon a functionality of the first solar panel that is different from a functionality of the second solar panels of the plurality of second solar panels.

* * * * *

UNITED STATES PATENT AND TRADEMARK OFFICE
CERTIFICATE OF CORRECTION

| | | |
|---|---|---|
| PATENT NO. | : 8,344,240 B2 | Page 1 of 1 |
| APPLICATION NO. | : 12/323448 | |
| DATED | : January 1, 2013 | |
| INVENTOR(S) | : James D. Bennett et al. | |

It is certified that error appears in the above-identified patent and that said Letters Patent is hereby corrected as shown below:

In the Claims

Col. 16, line 8, in claim 29: replace "the quantity" with --a quantity--

Signed and Sealed this
Nineteenth Day of November, 2013

Teresa Stanek Rea
*Deputy Director of the United States Patent and Trademark Office*